United States Patent [19]
DuPuy

[11] Patent Number: 5,539,352
[45] Date of Patent: Jul. 23, 1996

[54] LOW POWER VOLTAGE INPUT CIRCUIT WITH HIGH NOISE IMMUNITY AND FAST OPERATING TIME

[75] Inventor: Robert P. DuPuy, Cherry Hill, N.J.

[73] Assignee: General Electric Company, New York, N.Y.

[21] Appl. No.: 365,025

[22] Filed: Dec. 28, 1994

[51] Int. Cl.⁶ .......................... H03K 3/42; H03K 17/60; G05F 1/10; G02B 27/00
[52] U.S. Cl. ...................... 327/514; 327/538; 327/542; 327/484; 327/576; 250/551
[58] Field of Search ................................. 327/514, 483, 327/484, 369, 108, 376, 377, 538, 542, 576; 372/38; 250/551

[56] References Cited

U.S. PATENT DOCUMENTS

| | | | |
|---|---|---|---|
| 4,813,045 | 3/1989 | Culpepper | 372/38 |
| 5,068,545 | 11/1991 | Molnar | 372/38 |
| 5,373,518 | 12/1994 | Uchiyama et al. | 372/38 |

*Primary Examiner*—David C. Nelms
*Assistant Examiner*—Trong Phan
*Attorney, Agent, or Firm*—Schnader Harrison Segal & Lewis

[57] ABSTRACT

A voltage input circuit for providing an output in response to an input signal. According to a preferred embodiment of the invention, an output having a first state and a second state is generated. The output is switched from the first state to the second state when a capacitor is charged for a first predetermined time period by the input signal having a magnitude greater than a first predetermined threshold magnitude. The capacitor is disabled to prevent the output from switching from the first state to the second state if the input signal falls below the first predetermined threshold magnitude during the first time period. The output is switched from the second state to the first state when the input signal has a magnitude less than a second predetermined threshold magnitude for a second predetermined time period.

17 Claims, 3 Drawing Sheets

LOW POWER VOLTAGE INPUT CIRCUIT WITH HIGH NOISE IMMUNITY AND FAST OPERATING TIME

BACKGROUND OF THE INVENTION

1. Field of the Invention

The present invention relates to voltage input circuits, and in particular, to low power voltage input circuits with high noise immunity and fast operating times.

2. Description of the Related Art

Input circuits such as voltage input circuits may be configured to monitor an input voltage and provide an output to an external, electrically-isolated circuit when the input voltage changes by a given threshold. Input circuits may be used, for example, to monitor whether circuit breakers are in the closed or open state. For example, an auxiliary contact of a circuit breaker may be used to make or break a connection of a station battery which is typically 125 V DC. When the breaker is closed, the input auxiliary contact of the breaker closes, which connects the battery voltage to the input circuit so the input circuit may monitor whether the breaker is closed or open.

It is thus necessary to monitor the voltage delivered to the input circuit so that it can be known whether the breaker is open or closed. An input switch connected in parallel across the input terminals of the breaker will receive close to zero voltage when the breaker is open, and will receive the battery voltage when the breaker is closed and the battery is thus connected across the input terminals of the input circuit. Input circuits are typically designed to generate an output signal of one state when voltage below a predetermined threshold is applied to the input of the input circuit, and to generate an output signal of a second state when the input voltage is above a predetermined threshold. Input circuits typically generate a signal or produce an output that may be detected by an electrically isolated detection circuit so that, among other reasons, common mode noise is not transmitted from the bus and digital input circuit to the detection circuit.

Referring now to FIG. 1, there is shown a circuit diagram of a prior art input circuit 100. As will be understood by those skilled in the art, when voltage V rises above a certain threshold level, current I will flow through light-emitting diode ("LED") 110 where it may be detected by an external, electrically isolated light-detector circuit 111. Thus, whenever a voltage V applied to circuit 100 changes from a below-threshold level to an above-threshold level, detector circuit 111 can detect the occurrence of this change. This will occur when, for example, the contact connecting the battery to the input terminals of circuit 100 is closed, thereby changing voltage V from roughly zero volts to approximately 125 volts. As is known to those skilled in the art, LED 110 in combination with the electrically isolated circuit 111 designed to detect the light emitted by diode 110 may be part of an integrated opto-coupler device 112.

When such circuits are utilized for digital bus protection, a large number of such circuits may be required. Because a large number of devices can draw a large amount of power, there is a need for digital input circuits having low power requirements. Additionally, it is important that a digital input circuit maintain a fast response (or operating) time despite the low power requirement. It is also important that the digital input circuit have a high immunity to spurious noise such as transients or spikes, despite the need for fast operating time and low operating power, so that it does not erroneously indicate that an "on" input has been received when the input is actually "off", or erroneously indicate that the input has changed to the "off" state when it actually remains in the "on" state.

It is accordingly an object of this invention to overcome the disadvantages and drawbacks of the known art and to provide an input circuit having low power requirements.

It is a further object of this invention to provide such an input circuit that has a fast response time and high noise immunity.

Further objects and advantages of this invention will become apparent from the detailed description of a preferred embodiment which follows.

SUMMARY OF THE INVENTION

The previously mentioned objectives are fulfilled with the present invention. There is provided herein a voltage input circuit for providing an output in response to an input signal. According to a preferred embodiment of the invention, an output having a first state and a second state is generated. The output is switched from the first state to the second state when a charging means is charged for a first predetermined time period by the input signal having a magnitude greater than a first predetermined threshold magnitude. The charging means is disabled to prevent the output from switching from the first state to the second state if the input signal falls below the first predetermined threshold magnitude during the first time period. The output is switched from the second state to the first state when the input signal has a magnitude less than a second predetermined threshold magnitude for a second predetermined time period.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

Figure 2:
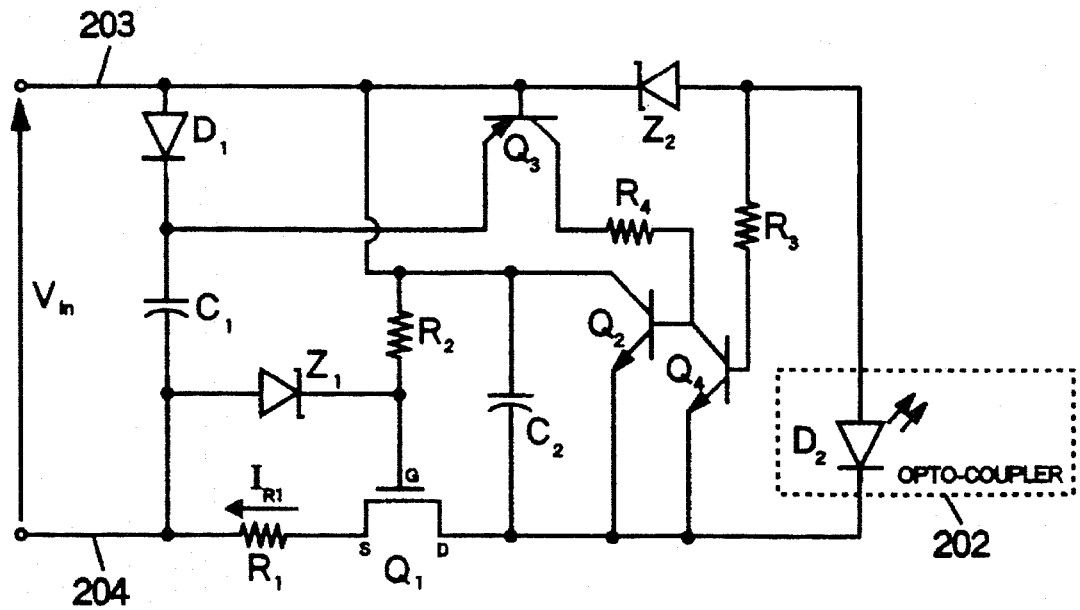
FIG. 2 is a circuit diagram of a digital input circuit in accordance with the present invention.

Referring now to FIG. 2, there is shown a circuit diagram of a digital input circuit 200 in accordance with the present invention. Input circuit 200 has first and second terminals 203 and 204 to which may be applied a voltage $V_{in}$, where $V_{in}$ is the input voltage which may be either in an "off" or "on" state, i.e. below or above a given threshold value (less than 38 volts to turn "on" from an "off" state, more than 20 volts to turn "off" from an "on" state). Input circuit 200 is designed so that opto-coupler 202 detects an "on" signal if and only if a voltage $V_{in}$ above a predetermined threshold is applied across input terminals 203 and 204.

In input circuit 200, a diode $D_1$ is electrically connected at its anode to first terminal 203 and at its cathode to the first end of capacitor $C_1$. The second end of capacitor $C_1$ is electrically connected to the junction of second terminal 204, anode of zener diode $Z_1$, and the first end of resistor $R_1$. In a preferred embodiment, capacitor $C_1$ has a capacitance of 0.001 µF, zener diode $Z_1$ is a 15-volt zener diode, and resistor $R_1$ has a resistance of 19k Ohms. The second end of resistor $R_1$ is electrically connected to the source of field-effect transistor $Q_1$, the gate of which is electrically connected to the cathode of zener diode $Z_1$ and through $R_2$ to first terminal 203. The drain of capacitor $Q_1$ is connected through capacitor $C_2$ to first terminal 203. In a preferred embodiment, capacitor $C_2$ has a capacitance of 0.033 µF, and resistor $R_2$ has a resistance of 2M Ohms.

First terminal 203 is electrically connected to the cathode of zener diode $Z_2$, to the base of a transistor $Q_3$, and to the collector of a transistor $Q_2$. The anode of zener diode $Z_2$ is electrically connected to the anode of LED $D_2$, the cathode of which is electrically connected to the drain of transistor $Q_1$. In a preferred embodiment, zener diode $Z_2$ is a 15-volt zener diode. The emitter of transistor $Q_3$ is electrically connected to the junction of diode $D_1$ and capacitor $C_1$, and the collector of transistor $Q_3$ is connected through a resistor $R_4$ to the junction of the base of transistor $Q_2$ and the collector of a transistor $Q_4$. The emitters of transistors $Q_2$ and $Q_4$ are electrically connected to the junction of the drain of $Q_1$ and the cathode of LED $D_2$. The base of transistor $Q_4$ is connected through resistor $R_3$ to the junction of the anode of zener diode $Z_2$ and the anode of LED $D_2$. In a preferred embodiment, resistor $R_4$ has a resistance of 200k Ohms, and resistor $R_3$ has a resistance of 22k Ohms. It will be appreciated that LED $D_2$ may be part of an integrated opto-coupler device 202.

Figure 3:
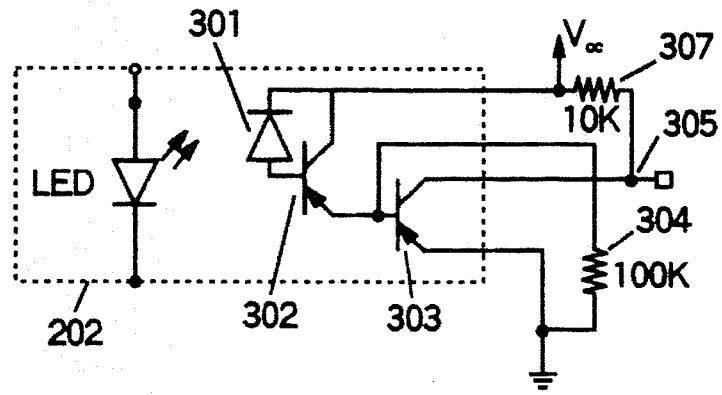
FIG. 3 is a circuit diagram of an opto-coupler utilized with the input circuit of FIG. 2.

Referring now to FIG. 3, there is shown a circuit diagram of opto-coupler 202 utilized with input circuit 200. When LED $D_2$ is turned on and emits light, the light is detected by light-sensitive transistor 302 of detector circuit 111, the base of which is connected to the anode of diode 301. The cathode of diode 301 is connected to the collector of transistor 302 and to a source voltage $V_{cc}$. The emitter of transistor 302 is electrically connected to the base of a transistor 303 and through a 100k resistor 304 to ground and to the emitter of transistor 303. The collector of transistor 303 is connected to output terminal 305, which indicates whether LED $D_2$ is on or not.

Digital input circuit 200 is configured so that LED $D_2$ will switch from "off" to "on" and thus emit light that may be detected by opto-coupler 202 when $V_{in}$ rises above a threshold magnitude, for example 38 volts, for a predetermined first time period. As described below, through the use of a fixed current source, the first time period is substantially fixed regardless of the magnitude of the input voltage $V_{in}$, e.g. whether a $V_{in}$ of 38 volts, 125 volts, or 200 volts is applied to input circuit 200. After LED $D_2$ has been switched "on", LED $D_2$ is subsequently switched "off" when $V_{in}$ drops below the threshold magnitude for a second time period, as explained below. LED $D_2$ therefore serves as an output means for providing an output when LED $D_2$ is in an on state, which output may be detected by a light-detecting circuit means which activates in response to light from LED $D_2$.

For example, if $V_{in}$ increases from a below-threshold value to an above-threshold value at time T=0, for example from 0 to 125 volts, and $V_{in}$ remains above the threshold value for the first time period, input circuit 200 will quickly cause LED $D_2$ to turn on. If, however, voltage $V_{in}$ only temporarily increases above the threshold due to a transient voltage spike, LED $D_2$ remains off while the spike is ignored. Once LED $D_2$ is on in response to an above-threshold $V_{in}$, LED $D_2$ remains on while $V_{in}$ remains above the threshold voltage. If a transient dip in voltage temporarily lowers voltage $V_{in}$ below the threshold, input circuit 200 ignores the negative spike and LED $D_2$ remains on. When $V_{in}$ finally drops below the threshold for more than a momentary transient time, i.e. for the second time period, LED $D_2$ is quickly switched off so that opto-coupler 202 no longer detects the "on" state of LED $D_2$.

Therefore, input circuit 200 is configured as a low power digital input circuit with high noise immunity and a fast operating or response time, and operates as described in further detail below. It will be understood that the first threshold which $V_{in}$ must be above to switch input LED $D_2$ from "off" to "on" may be different from a second threshold that $V_{in}$ must be below to switch input LED $D_2$ from "on" to "off". In a preferred embodiment, these thresholds are each within a range of 20–38 volts. A typical "on" voltage will be well above this threshold range, e.g. 125 volts, and a typical "off" voltage will be approximately zero volts, well below this range.

When a voltage $V_{in}$ which is above the threshold value is applied to first and second terminals 203 and 204 at time T=0, capacitors $C_1$ and $C_2$ begin to charge. When during the first time period $C_2$ charges to a voltage $V_{c2}$ higher than the 15 V threshold voltage of $Z_2$ plus the forward voltage drop of LED $D_2$, LED $D_2$ is turned on, causing opto-coupler 202 to be turned on as well. At this point the voltage across LED $D_2$ causes a current to flow through resistor $R_3$ and the base emitter of transistor $Q_4$, turning it on. When $Q_4$ turns on, this shorts out the base to emitter of transistor $Q_2$, which prevents $Q_2$ from turning on. Thus once LED $D_2$ is turned on $Q_2$ is off, so that $Q_2$ will not short out the voltage across $C_2$ (which would cause LED $D_2$ to turn off). In this manner input circuit 200 comprises a constant rate charging means for allowing LED $D_2$ to switch from the off state to the on state when $C_2$ is charged for a first predetermined time period by the input signal having a magnitude greater than a first predetermined threshold magnitude.

$C_1$ also charges starting at time T=0 through diode $D_1$. If a transient voltage surge $V_{in}$ is applied to input circuit 200, after the momentary above-threshold voltage $V_{in}$ is removed capacitor $C_1$ discharges through $Q_3$, $R_4$ and $Q_2$, thereby shorting out $C_2$. Since $C_2$ is shorted out, it is not able to charge up to a voltage $V_{c2}$ higher than the 15V threshold voltage of $Z_2$ plus the forward voltage drop of LED $D_2$, and therefore LED $D_2$ will not be turned on because the voltage across $Z_2$ and LED $D_2$ will not be high enough. Therefore, transient voltage spikes will not turn on LED $D_2$, so that input circuit 200 is immune to such positive transients. Thus, the time from T=0 to the moment $C_2$ is sufficiently charged to allow LED $D_2$ to switch on is the first time period that allows input circuit 200 to be immune from positive voltage spikes of a duration less than this first time period. It will be appreciated by those skilled in the art that if an above-threshold $V_{in}$ is applied to input circuit 200 for the length of the first time period (i.e., it is not transient), capacitor $C_1$ will not discharge in the foregoing manner, and will not short out $C_2$. Input circuit 200 therefore comprises a disabling means for discharging $C_2$ to prevent LED $D_2$ from switching from the off state to the on state if the input signal falls below the first predetermined threshold magnitude during the first time period.

During the operation of input circuit 200, a current source comprising $Z_1$, $R_1$, $R_2$, and $Q_1$ causes current $I_{R1}$ to flow, the magnitude of which is essentially independent of the magnitude of $V_{in}$. The voltage of zener diode $Z_1$ minus the voltage gate-to-source of field-effect transistor $Q_1$ provide an essentially constant voltage across resistor $R_1$, so that an essentially constant current $I_{R1}$ flows through $R_1$. This current source establishes a relatively fixed time constant to switch on LED $D_2$. As will be understood by those skilled in the art, before LED $D_2$ is switched on, most of the fixed current $I_{R1}$ also flows through $C_2$, since $D_2$ and $Q_2$ are not turned on. Because current $I_{R1}$ is substantially constant regardless of the magnitude of $V_{in}$, the rate at which capacitor $C_2$ charges is also relatively constant, in accordance with the equation: $t=(\text{delta } V * C_2)/I_{R1}$, where t is time, and delta V is the voltage change across $C_2$, where delta $V=V_{Z2}+V_{D2}$.

After LED $D_2$ is turned on, it remains on until voltage $V_{in}$ drops below a second threshold voltage for a second time period. Thus, when $V_{in}$ drops below the threshold, $C_1$ discharges through $Q_3$, $R_4$, and $Q_4$ until the short is removed from the base of $Q_2$, as will be understood by those skilled in the art. When the short is removed from the base of $Q_2$, $Q_2$ is turned on, thereby shorting out and discharging $C_2$, and shorting out the series-connected $Z_2$ and LED $D_2$. Those skilled in the art will understand that LED $D_2$ will therefore turn off. The time that $C_1$ takes to discharge in this manner to cause LED $D_2$ to turn off is considered to be the second time period.

If, however, $V_{in}$ drops below the second threshold for less than the second time period, it is considered to be a merely transient voltage dip which should not cause LED $D_2$ to turn off. When this occurs, $C_1$ begins to discharge through $Q_3$, $R_4$, and $Q_4$ as described above. If $V_{in}$ rises back above the second threshold before the end of the second time period, $C_1$ will not be discharged enough to remove the short from the base of $Q_2$, and $C_2$ and the series-connected $Z_2$ and LED $D_2$ will not be shorted out. Therefore, for merely transient negative voltage dips, i.e. for below-threshold voltages that last for less than the second time period, LED $D_2$ remains on. In this manner transient voltage spikes in the negative direction will not turn off LED $D_2$, so that input circuit 200 is immune to such transients. It will be understood that the time from the moment $V_{in}$ drops below the second threshold to the time that LED $D_2$ is turned off by the effect of $Q_2$ turning on is the second time period that allows input circuit 200 to be immune from negative voltage spikes of a duration less than this second time period. Input circuit 200 therefore comprises a means for switching LED $D_2$ from the on state to the off state when the input signal has a magnitude less than a second predetermined threshold magnitude for a second predetermined time period.

Figure 1:
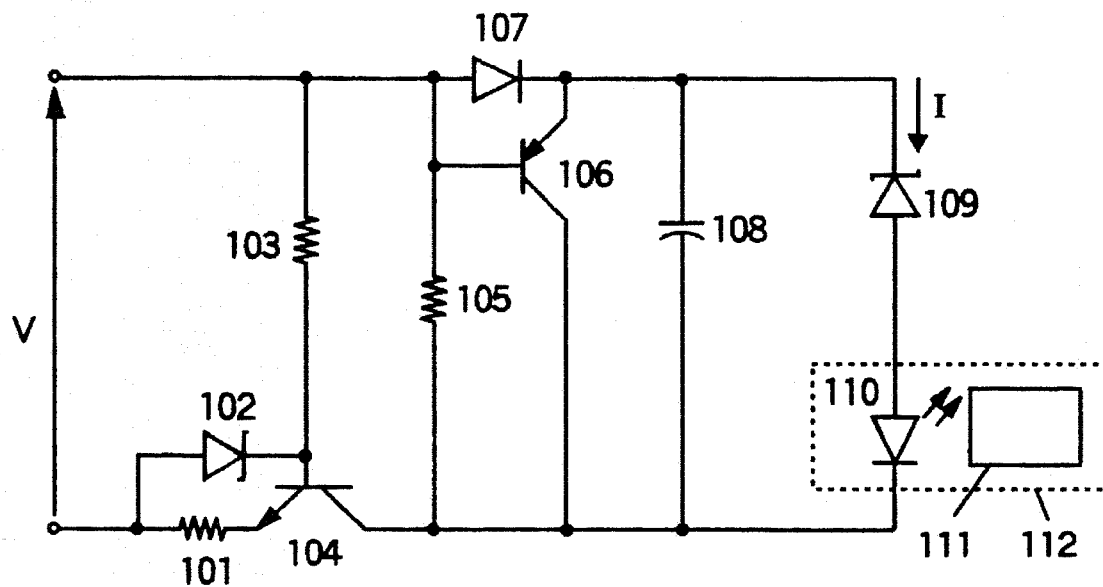
FIG. 1 is a circuit diagram of a prior art input circuit.

In an actual working embodiment of input circuit 200 with components having the preferred parameters specified above, input circuit 200 has approximately the following properties. If an input voltage $V_{in}$ of at least 38 volts is applied to input circuit 200, LED $D_2$ is switched on after $V_{in}$ is maintained at this level for at least 0.8 milliseconds (the first time period). A voltage spike of a duration less than this first time period will consequently fail to turn on LED $D_2$. Typically, an input voltage $V_{in}$ of approximately 125 volts will be applied to input circuit 200 to switch LED $D_2$ on. Once LED $D_2$ has been turned on, e.g. due to a 125-volt $V_{in}$, when input voltage $V_{in}$ drops below 20 volts, LED $D_2$ will be switched off after $V_{in}$ is maintained at this level for at least 0.15 milliseconds (the second time period). While LED $D_2$ is on, current $I_{R1}$ is approximately 0.6 mA (for in input voltage $V_{in}$ of 125 volts), and input circuit 200 draws approximately 0.075 Watts. For comparison, prior art circuits such as circuit 100 of FIG. 1 draw approximately 0.25 Watts (for 125 volt input at 2 mA), with a typical response time of approximately 0.5 milliseconds. Therefore, input circuit draws a relatively low amount of power, while maintaining a fast response time and while remaining substantially immune to voltage transients.

Figure 4:
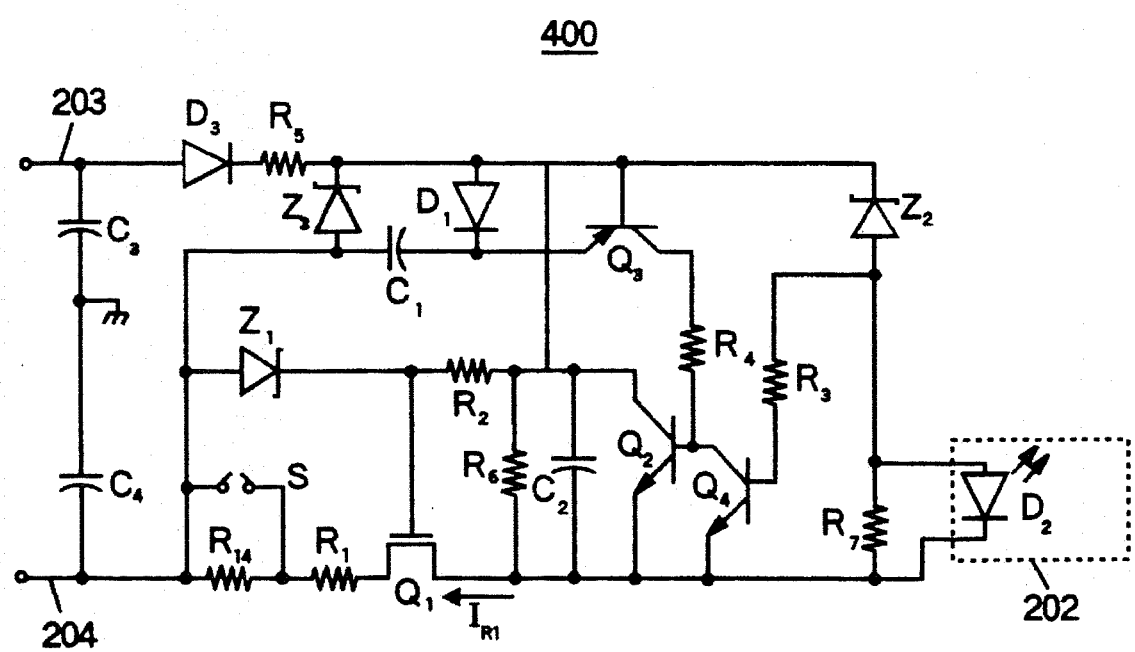
FIG. 4 is a circuit diagram of an alternative preferred embodiment of a digital input circuit in accordance with the present invention.

Referring now to FIG. 4, there is shown a circuit diagram of an alternative preferred embodiment of a digital input circuit 400 in accordance with the present invention. Digital input circuit 400 contains all of the elements of input circuit 200, and also contains surge capacitors $C_3$ and $C_4$ connected in series across first and second terminals 203 and 204 and electrically connected to ground at their junction. These surge capacitors are used to reduced voltage spikes at terminals 203 and 204. The anode of diode $D_1$ is connected to first terminal 203 through resistor $R_5$ and diode $D_3$, as illustrated further in FIG. 4. Resistor $R_5$ serves to limit the amount of current drawn by capacitor $C_1$ for fast rising input voltages to protect $D_1$. Diode $D_3$ serves as a safety device to prevent damage due to connecting a reverse input polarity to second and first terminals 204 and 203 of input circuit 400. In a preferred embodiment of input circuit 400, capacitors $C_3$ and $C_4$ each have a capacitance of 0.0047 µF, and resistor $R_5$ has a resistance of 6.2k Ohms.

A transient voltage suppressor diode $Z_3$ is connected at its cathode to the anode of diode $D_1$ and at its anode to second terminal 204. Diode $Z_3$ is a high-absorption device, also known as a "transor," which prevents more than, for example, 500 volts from being applied to the circuit. The purpose of this diode is to prevent very high voltages from damaging the circuit, for example the MOS device $Q_1$. Resistors $R_1$ and $R_{1A}$ have a resistance of 19k Ohms each. A switch S is connected in parallel across resistor $R_{1A}$ to short out resistor $R_{1A}$ if its resistance is not to be added in series to that of resistor $R_1$. In a preferred embodiment, switch S is closed so that only resistor $R_1$ is utilized in the circuit. Resistor $R_6$ is connected in parallel with capacitor $C_2$, to serve as an extra discharge source for capacitor $C_2$. Resistor $R_7$ is connected in parallel with LED $D_2$, to draw away some of the leakage current from $Z_2$ that may flow before its turn on voltage is reached, and that would otherwise flow through LED $D_2$. In a preferred embodiment, resistor $R_6$ has a resistance of 200k Ohms, and resistor $R_7$ has a resistance of 47k Ohms.

Figure 5:
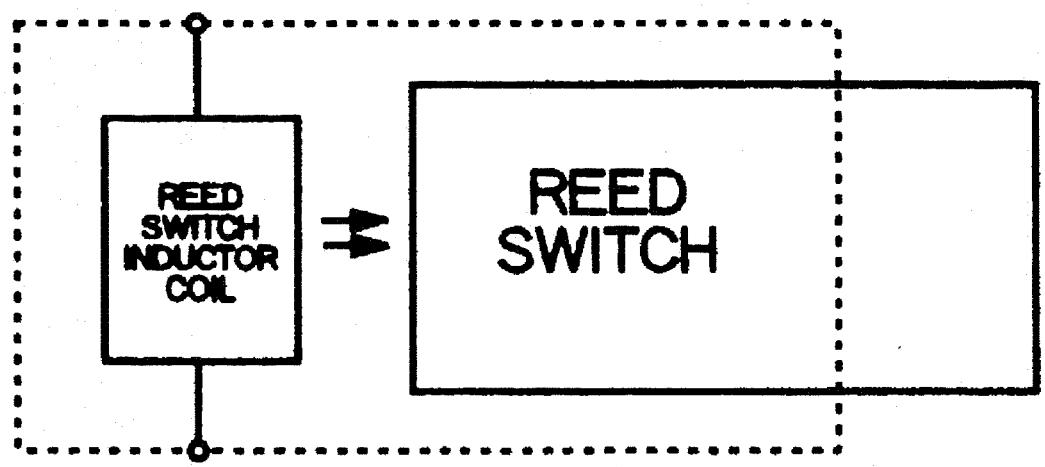
FIG. 5 is a circuit diagram of a reed switch utilized with the input circuit of FIG. 2.

It will be understood by those skilled in the art that other current-sensing devices may be utilized with input circuits 200 and 400, other than LED $D_2$ and opto-coupler circuit 202. For example, an inductor coil may be utilized in place of LED $D_2$ to close an electrically-isolated reed switch, as illustrated in FIG. 5.

It will be understood that various changes in the details, materials, and arrangements of the parts and features which have been described and illustrated above in order to explain the nature of this invention may be made by those skilled in the art without departing from the principle and scope of the invention as recited in the following claims.

What is claimed is:

1. A voltage input circuit for providing an output in response to an input signal, the input circuit comprising:

(a) output means for generating an output having a first state and a second state;

(b) charging means coupled to the output means for allowing the output to switch from the first state to the second state after the charging means is charged for a first predetermined time period by the input signal having a magnitude greater than a first predetermined threshold magnitude; wherein the input signal has a magnitude that may fall below the first predetermined threshold magnitude during the first predetermined time period;

(c) disabling means coupled to the input signal and to the charging means for disabling the charging means to prevent the output from switching from the first state to the second state if the input signal falls below the first predetermined threshold magnitude during the first time period; and (d) switching means coupled to the charging means and to the output means for switching the output from the second state to the first state when the input signal has a magnitude less than a second predetermined threshold magnitude for a second predetermined time period.

2. The circuit of claim 1, wherein:

the charging means further comprises current source means for charging the charging means at a constant rate in response to the input signal having a magnitude greater than a first predetermined threshold magnitude; and the switching means further comprises means for discharging the charging means when the input signal has a magnitude less than the second predetermined threshold magnitude for the second predetermined time period.

3. The circuit of claim 1, wherein the first state comprises an off state and the second state comprises an on state.

4. The circuit of claim 1, wherein the output is in the second state when an output current flows through the output means.

5. The circuit of claim 4, wherein:

the output means comprises a light-emitting diode, wherein the output comprises light emitted by the light-emitting diode when the output current flows through the light-emitting diode.

6. The circuit of claim 5, wherein the light-emitting diode is coupled to an external electrically-isolated light-detecting circuit means for activating in response to the light.

7. The circuit of claim 5, wherein:

the output means further comprises a first zener diode coupled at its anode to the anode of the light-emitting diode, whereby the output current flows through the light-emitting diode when at least a first potential is applied from the cathode of the first zener diode to the cathode of the light-emitting diode.

8. The circuit of claim 7, further comprising:

(e) a first input terminal and a second input terminal for receiving the input signal, wherein the input signal comprises an input voltage;

wherein the charging means comprises a first capacitor;

wherein the disabling means and the switching means comprise:

first, second, third, and fourth resistors;

a second capacitor;

first, second, third, and fourth transistors, wherein the first transistor is a field-effect transistor, the second and fourth transistors are npn transistors, and the third transistor is a pnp transistor; and a second zener diode and a first diode; wherein:

the first diode is coupled at its anode to the first terminal and at its cathode to the emitter of the third transistor and at its cathode through the second capacitor to the second terminal;

the first terminal is further coupled to the gate of the first transistor through the second resistor, to the base of the third transistor, to the cathode of the first zener diode, to the collector of the second transistor, and through the first capacitor to the drain of the first transistor;

the second terminal is coupled to the anode of the second zener diode and through the first resistor to the source of the first transistor, and the cathode of the second zener diode is coupled to the drain of the first transistor;

the junction of the anode of the first zener diode and the anode of the light-emitting emitting diode are coupled through the third resistor to the base of the fourth resistor;

the collector of the third transistor is connected through the fourth resistor to the junction of the collector of the fourth transistor and the base of the second transistor, the emitters of the second and fourth transistors are coupled to the junction of the cathode of the light-emitting diode and the drain of the first transistor.

9. The circuit of claim 8, further comprising:

third and fourth capacitors;

fifth, sixth, and seventh resistors; and a second diode;

wherein:

the second diode and the fifth resistor are coupled in series between the first terminal and the anode of the first diode;

the third zener diode is coupled at its cathode to the anode of the first diode and at its anode to the second terminal;

the third and fourth capacitors are coupled in series between the first and second terminals and are coupled to ground at their juncture;

the sixth resistor is coupled in parallel with the first capacitor; and the seventh resistor is coupled in parallel with the light-emitting diode.

10. The circuit of claim 9, wherein the first state comprises an off state and the second state comprises an on state.

11. The circuit of claim 4, wherein:

the output means comprises a reed switch inductor coil, wherein the output comprises a magnetic field generated by the coil when the output current flows through the coil, wherein the coil is coupled to an external electrically-isolated reed switch for closing in response to the magnetic field.

12. A voltage input circuit for providing an output in response to an input signal, the input circuit comprising:

a first input terminal and a second input terminal for receiving the input signal, wherein the input signal comprises an input voltage;

first, second, third, and fourth resistors;

first and second capacitors;

first, second, third, and fourth transistors, wherein the first transistor is a field-effect transistor, the second and fourth transistors are npn transistors, and the third transistor is a pnp transistor; and a zener diode, a second zener diode, a light-emitting diode, and a second diode; wherein:

the zener diode is coupled at its anode to the anode of the light-emitting diode;

the second diode is coupled at its anode to the first terminal and at its cathode to the emitter of the third transistor and at its cathode through the second capacitor to the second terminal;

the first terminal is further coupled to the gate of the first transistor through the second resistor, to the base of the third transistor, to the cathode of the zener diode, to the collector of the second transistor, and through the first capacitor to the drain of the first transistor;

the second terminal is coupled to the anode of the second zener diode and through the first resistor to the source of the first transistor, and the cathode of the second zener diode is coupled to the gate of the first transistor;

the junction of the anode of the zener diode and the anode of the light-emitting diode are coupled through the third resistor to the base of the fourth resistor;

the collector of the third transistor is connected through the fourth resistor to the junction of the collector of the fourth transistor and the base of the second transistor, the emitters of the second and fourth transistors are coupled to the junction of the cathode of the light-emitting diode and the drain of the first transistor.

13. The circuit of claim 12, further comprising:

third and fourth capacitors;

fifth, sixth, and seventh resistors; and a second diode; wherein:

the second diode and the fifth resistor are coupled in series between the first terminal and the anode of the first diode;

the third zener diode is coupled at its cathode to the anode of the first diode and at its anode to the second terminal;

the third and fourth capacitors are coupled in series between the first and second terminals and are coupled to ground at their juncture;

the sixth resistor is coupled in parallel with the first capacitor; and the seventh resistor is coupled in parallel with the light-emitting diode.

14. A method for providing an output in response to an input signal, the method comprising the steps of:

(a) generating with an output means an output having a first state and a second state;

(b) switching the output from the first state to the second state when a charging means is charged for a first predetermined time period by the input signal having a magnitude greater than a first predetermined threshold magnitude; wherein the charging means is coupled to the output means, further wherein the input signal has a magnitude that may fall below the first predetermined threshold magnitude during the first predetermined time period;

(c) disabling, with a disabling means coupled to the input signal and to the charging means, the charging means to prevent the output from switching from the first state to the second state if the input signal falls below the first predetermined threshold magnitude during the first time period; and (d) switching, with a switching means coupled to the charging means and to the output means, the output from the second state to the first state when the input signal has a magnitude less than a second predetermined threshold magnitude for a second predetermined time period.

15. The method of claim 14, wherein the first state comprises an off state and the second state comprises an on state.

16. The method of claim 14, wherein:

step (b) further comprises the step of charging the charging means at a constant rate in response to the input signal having a magnitude greater than a first predetermined threshold magnitude; and step (d) further comprises the step of discharging the charging means when the input signal has a magnitude less than the second predetermined threshold magnitude for the second predetermined time period.

17. The method of claim 14, wherein the output is in the second state only when an output current flows therethrough.

* * * * *

UNITED STATES PATENT AND TRADEMARK OFFICE
CERTIFICATE OF CORRECTION

PATENT NO. : 5,539,352
DATED : July 23, 1996
INVENTOR(S) : Robert P. DePuy

It is certified that error appears in the above-identified patent and that said Letters Patent is hereby corrected as shown below:

On the title page,

Item [75], Inventor section, delete    "Robert P. DuPuy" and
                        substitute -- Robert P. DePuy --.

Signed and Sealed this

Twenty-first Day of April, 1998

Attest:

BRUCE LEHMAN

Attesting Officer    Commissioner of Patents and Trademarks